US008825939B2

(12) United States Patent
Oh et al.

(10) Patent No.: US 8,825,939 B2
(45) Date of Patent: Sep. 2, 2014

(54) SEMICONDUCTOR MEMORY DEVICE SUITABLE FOR INTERCONNECTION IN A RING TOPOLOGY

(75) Inventors: HakJune Oh, Kanata (CA); Jin-Ki Kim, Kanata (CA)

(73) Assignee: Conversant Intellectual Property Management Inc., Ottawa, Ontario (CA)

( * ) Notice: Subject to any disclaimer, the term of this patent is extended or adjusted under 35 U.S.C. 154(b) by 1191 days.

(21) Appl. No.: 12/141,384

(22) Filed: Jun. 18, 2008

(65) Prior Publication Data

US 2009/0154284 A1    Jun. 18, 2009

Related U.S. Application Data

(60) Provisional application No. 61/013,036, filed on Dec. 12, 2007.

(51) Int. Cl.
*G06F 12/00* (2006.01)
*G11C 8/00* (2006.01)

(52) U.S. Cl.
USPC .. 711/103; 711/154; 365/185.18; 365/189.02

(58) Field of Classification Search
None
See application file for complete search history.

(56) References Cited

U.S. PATENT DOCUMENTS

| | | |
|---|---|---|
| 4,679,173 A | 7/1987 | Sato |
| 4,899,316 A | 2/1990 | Nagami |
| 4,914,574 A | 4/1990 | Terada et al. |
| 5,204,669 A | 4/1993 | Dorfe et al. |
| 5,243,703 A | 9/1993 | Farmwald et al. |
| 5,357,621 A | 10/1994 | Cox |
| 5,384,735 A | 1/1995 | Park et al. |
| 5,404,460 A | 4/1995 | Thomsen et al. |
| 5,430,859 A | 7/1995 | Norman et al. |
| 5,636,342 A | 6/1997 | Jeffries |
| 5,740,379 A | 4/1998 | Hartwig |
| 5,771,199 A | 6/1998 | Lee |
| 5,778,419 A | 7/1998 | Hansen et al. |
| 5,802,399 A | 9/1998 | Yumoto et al. |

(Continued)

FOREIGN PATENT DOCUMENTS

| | | |
|---|---|---|
| CA | 2 310 080 A1 | 5/1999 |
| WO | WO 2006/036811 A2 | 4/2006 |

OTHER PUBLICATIONS

Saito, et al., "A Programmable 80ns 1Mb CMOS EPROM", IEEE ISSCC Digest of Technical Papers, Feb. 14, 1985, pp. 176-177, 340.

(Continued)

*Primary Examiner* — Kaushikkumar Patel

(57) ABSTRACT

A semiconductor memory device, which comprises: memory; a plurality of inputs for receiving a command latch enable signal, an address latch enable signal, an information signal and a select signal indicative of whether the memory device has been selected by a controller; a plurality of outputs for releasing a set of output signals towards a next device; control circuitry; and bypass circuitry. When the select signal is indicative of the memory device having been selected by the controller, the control circuitry is configured to interpret the information signal based on the command latch enable signal and the address latch enable signal. When the select signal is indicative of the memory device not having been selected by the controller, the bypass circuitry is configured to transfer the command latch enable signal, the address latch enable signal and the information signal to the outputs of the memory device.

15 Claims, 11 Drawing Sheets

(56) References Cited

U.S. PATENT DOCUMENTS

| | | | |
|---|---|---|---|
| 5,806,070 A | 9/1998 | Norman et al. | |
| 5,828,899 A | 10/1998 | Richard et al. | |
| 5,844,858 A | 12/1998 | Kyung | |
| 5,859,809 A | 1/1999 | Kim | |
| 5,872,994 A | 2/1999 | Akiyama et al. | |
| 5,900,021 A | 5/1999 | Tiede et al. | |
| 5,941,974 A | 8/1999 | Babin | |
| 5,959,890 A | 9/1999 | Yamamoto et al. | |
| 6,002,638 A | 12/1999 | John | |
| 6,009,479 A | 12/1999 | Jeffries | |
| 6,102,963 A | 8/2000 | Agrawal | |
| 6,144,576 A | 11/2000 | Leddige et al. | |
| 6,148,363 A | 11/2000 | Lofgren et al. | |
| 6,215,726 B1 | 4/2001 | Kubo | |
| 6,253,292 B1 | 6/2001 | Jhang et al. | |
| 6,317,350 B1 | 11/2001 | Pereira et al. | |
| 6,317,352 B1 | 11/2001 | Halbert et al. | |
| 6,317,812 B1 | 11/2001 | Lofgren et al. | |
| 6,373,289 B1 | 4/2002 | Martin et al. | |
| 6,453,365 B1 | 9/2002 | Habot | |
| 6,567,904 B1 | 5/2003 | Khandekar et al. | |
| 6,625,687 B1* | 9/2003 | Halbert et al. | 711/105 |
| 6,654,307 B2 | 11/2003 | Widmer et al. | |
| 6,658,509 B1 | 12/2003 | Bonella et al. | |
| 6,680,904 B1 | 1/2004 | Kaplan et al. | |
| 6,763,426 B1 | 7/2004 | James et al. | |
| 6,792,003 B1 | 9/2004 | Potluri et al. | |
| 6,877,079 B2 | 4/2005 | Yoo et al. | |
| 6,919,736 B1 | 7/2005 | Agrawal et al. | |
| 6,928,501 B2 | 8/2005 | Andreas et al. | |
| 6,944,697 B2 | 9/2005 | Andreas | |
| 6,950,325 B1 | 9/2005 | Chen | |
| 6,996,644 B2 | 2/2006 | Schoch et al. | |
| 7,017,002 B2 | 3/2006 | Perego et al. | |
| 7,031,221 B2 | 4/2006 | Mooney et al. | |
| 7,093,076 B2 | 8/2006 | Kyung | |
| 7,130,958 B2 | 10/2006 | Chou et al. | |
| 7,334,070 B2 | 2/2008 | Borkenhagen | |
| 7,515,471 B2 | 4/2009 | Oh et al. | |
| 7,613,023 B2* | 11/2009 | Drexler et al. | 365/63 |
| 2002/0083255 A1 | 6/2002 | Greeff et al. | |
| 2002/0122347 A1 | 9/2002 | Frulio et al. | |
| 2002/0188781 A1 | 12/2002 | Schoch et al. | |
| 2003/0188091 A1* | 10/2003 | Wyatt et al. | 711/111 |
| 2004/0001380 A1 | 1/2004 | Becca et al. | |
| 2004/0148482 A1 | 7/2004 | Grundy et al. | |
| 2005/0146980 A1* | 7/2005 | Mooney et al. | 365/233 |
| 2005/0160218 A1 | 7/2005 | See et al. | |
| 2006/0031593 A1 | 2/2006 | Sinclair | |
| 2006/0036827 A1 | 2/2006 | Dell et al. | |
| 2006/0271746 A1* | 11/2006 | Meyer et al. | 711/148 |
| 2006/0294335 A1* | 12/2006 | Vogt | 711/170 |
| 2007/0005831 A1 | 1/2007 | Gregorius | |
| 2007/0046331 A1* | 3/2007 | Kwon et al. | 326/83 |
| 2007/0058480 A1 | 3/2007 | Hwang | |
| 2007/0064629 A1 | 3/2007 | Regev et al. | |
| 2007/0073927 A1* | 3/2007 | Lu | 710/36 |
| 2007/0076479 A1 | 4/2007 | Kim et al. | |
| 2007/0076502 A1 | 4/2007 | Pyeon et al. | |
| 2007/0106836 A1* | 5/2007 | Lee et al. | 711/103 |
| 2007/0109833 A1 | 5/2007 | Pyeon et al. | |
| 2007/0133338 A1* | 6/2007 | Hoffmann | 365/233 |
| 2007/0143677 A1 | 6/2007 | Pyeon et al. | |
| 2007/0153576 A1 | 7/2007 | Oh et al. | |
| 2007/0165457 A1 | 7/2007 | Kim | |
| 2007/0233903 A1 | 10/2007 | Pyeon | |
| 2007/0233917 A1 | 10/2007 | Pyeon et al. | |
| 2007/0234071 A1 | 10/2007 | Pyeon | |
| 2007/0258295 A1 | 11/2007 | Kagan et al. | |
| 2008/0016269 A1 | 1/2008 | Chow et al. | |
| 2008/0019196 A1* | 1/2008 | Lin | 365/193 |
| 2008/0084727 A1* | 4/2008 | Norman | 365/63 |
| 2008/0235438 A1* | 9/2008 | Zhang | 711/103 |
| 2008/0279003 A1 | 11/2008 | Kim et al. | |
| 2009/0043948 A1* | 2/2009 | Wittenburg et al. | 711/103 |

OTHER PUBLICATIONS

Kirisawa, R. et al., "A NAND Structured Cell with a new Programming Tech . . . ", 1990 Symposium on VLSI Tech., Jun. 4, 1990, Ch 2874-6, 90/0000-0129 1990 IEEE, Honolulu, pp. 129-130.

Aritome, S. et al., "A Reliable Bi-Polarity Write/Erase Technology in Flash EEPROMs", Int'l. Electron Devices Meeting, 1990, Technical Digest, Dec. 9-12, 1990, pp. 111-114.

Shirota, R., et al., "A 2.3um2 Memory Cell Structure for 16Mb NAND EEPROMs", International Electron Devices Meeting 1990, Technical Digest, (1990), pp. 103-106.

Samsung Electronics Co. Ltd, "256M × 8 Bit / 128 M × 16 Bit / 512M × 8 Bit NAND Flash Memory", K9K4GO8U1M, May 6, 2005, pp. 1-41.

Samsung Electronics Co. Ltd, "1G × 8 Bit / 1G × 8 Bit NAND Flash Memory", K9F8G08UXM, May 31, 2007, pp. 1-54.

Samsung Electronics Co. Ltd, "512M × 8 Bit / 1G × 8 Bit NAND Flash Memory", K9XXG08UXA, May 7, 2006, pp. 1-43.

Samsung Electronics Co. Ltd, "1G × 8 Bit / 2G × 8 Bit / 4G × 8 Bit NAND Flash Memory", K9XXG08UXA, Jul. 18, 2006, pp. 1-50.

Gal, et al., "Algorithms and data structures for flash memories", ACM Computing Surveys (CSUR), vol. 37, No. 2, p. 138-163, Jun. 2005, Tel Aviv University.

Samsung Electronics Co. Ltd, "2G × 8 Bit NAND Flash Memory", K9GAG08U0M, Apr. 12, 2006, pp. 1-48.

Toshiba, "16 Gbit (2G × 8 Bit) CMOS NAND E2PROM (Multi-Level-Cell)", TC58NVG4D1DTG00, Nov. 9, 2006.

Amtel, "8-megabit 2.5-volt Only or 2.7-volt Only DataFlash®," Technical Specification, Atmel, Rev. 2225H-DFLSH (2004).

"The I2C-Bus Specification," Version 2.1, Philips Semiconductors, Jan. 2000, 46 pages.

"16 Mbit SPI Serial Flash," Preliminary Specification, Silicon Storage Technology Inc., (2005), 28 pages.

"HyperTransport TM I/O Link Specification", Revision 3.00a, Document No. HTC20051222-0046-0017, 2001-2006, Hypertransport Technology Consortium, Nov. 22, 2006, pp. 1-443.

International Search Report mailed on Jan. 16, 2009 in connection with International Application No. PCT/CA2008/001756.

Written Opinion of the International Searching Authority mailed on Jan. 16, 2009 in connection with International Application No. PCT/CA2008/001756.

Stein Gjessing et al., "A RAM link for high speed", IEEE Spectrum, Oct. 1992, pp. 52-53.

Stephen L. Diamond, "SyncLink: High-speed DRAM for the future", Micro Standards, IEEE Micro, Dec. 1996, pp. 74-75.

Business Wire, "ONFi Breaks Speed Barrier for NAND Flash", Nov. 14, 2007, 3 pages.

Stein Gjessing et al., "RamLink: A High-Bandwidth Point-to-Point Memory Architecture", Copyright 1992 IEEE, pp. 328-331.

Stein Gjessing et al., "Performance of the RamLink Memory Architcture", Copyright 1994 IEEE, pp. 154-162.

Yoichi Oshima et al., "High-Speed Memory Architectures for Multimedia Applications", IEEE, Circuits & Devices, Jan. 1997, pp. 8-13.

Ken Takeuchi et al., "A 56-nm CMOS 99-mm2 8-Gb Multi-Level NAND Flash Memory with . . . ", IEEE Journal of Solid-State Circuits, vol. 42, No. 1, Jan. 2007, pp. 219-232.

Atsushi Inoue et al., "NAND Flash Applications Design Guide", System Solutions from Toshiba America Electronic Components, Inc., Revision 1.0, Apr. 2003, 29 pages.

Toshiba, "TH58NVG1S3AFT05", "Tentative Toshiba MOS Digital Integrated Circuit Silicon Gate CMOS", May 19, 2003, 32 pages.

Shahed Ameer—Applications Engineer, TNMS001, "Enabling Platform Non-Volatile Memory Solutions", Intel Developer Forum, on or before Feb. 13, 2008, 38 pages.

Mosaid Technologies Incorporated, "Multiple Independent Serial Link (MISL) Flash Specification", Version 0.0, Aug. 29, 2005, 71 pages.

(56) References Cited

OTHER PUBLICATIONS

Micron Technology, Inc., "NAND Flash Memory", 4Gb, 8Gb, and 16Gb ×8 NAND Flash Memory Features, Copyright 2006, 81 pages.
MOSAID Technologies Incorporated, "HyperLink NAND (HLNAND) Flash Specification—HL1-200 / HL1-266", Version 1.61, May 25, 2007, 83 pages.
"IEEE Standard for High-Bandwidth Memory Interface Based on Scalable Coherent Interface (SCI) Signaling Technology (RamLink)", IEEE Standards Board Mar. 19, 1996, 98 pages.
ONFI Workgroup, "Open NAND Flash Interface Specification", Revision 1.0, Dec. 28, 2006, 106 pages.
ONFI Workgroup, "Open NAND Flash Interface Specification", Revision 2.0, Feb. 27, 2008, 174 pages.

* cited by examiner

| Command | Command Cycle 1 | # of Address Cycles | Data Cycles Required | Command Cycle 2 |
|---|---|---|---|---|
| PAGE READ | 00h | 5 | No | 30h |
| RANDOM DATA OUTPUT | 05h | 2 | No | E0h |
| READ STATUS | 70h | - | No | - |
| PAGE PROGRAM | 80h | 5 | Yes | 10h |
| RANDOM DATA INPUT | 85h | 2 | Yes | - |
| BLOCK ERASE | 60h | 3 | No | 00h |
| RESET | FFh | - | No | - |

FIG. 2

SEMICONDUCTOR MEMORY DEVICE SUITABLE FOR INTERCONNECTION IN A RING TOPOLOGY

CROSS-REFERENCE TO RELATED APPLICATION

The present application claims the benefit under 35 U.S.C. 119(e) of U.S. Provisional Patent Application Ser. No. 61/013,036, filed on Dec. 12, 2007, hereby incorporated by reference herein.

BACKGROUND

Non-volatile memory devices are in use today for storing digital pictures, computer files, digitally recorded music and so on. It is common to find non-volatile memory devices in everyday electronics such as computers, digital cameras, MP3 players, answering machines, cell phones, etc.

Non-volatile memory devices comes in various forms. One example of a non-volatile memory device is a magnetic disk, as can be found in many computer hard drives. Another example is an optical disk such as a CD-R/W. Yet another example is a solid state memory circuit such as an electrically erasable and programmable read-only memory (EEPROM), a specific example of which is a flash memory device. A flash memory device utilizes high voltages to erase a block of memory cells in one operation, allowing these cells to then be reprogrammed with new data. By virtue of their robustness, convenience and low cost, solid state memory devices, particularly flash memory devices, have gained immense popularity in the marketplace and are expected to become even more dominant as the demand for non-volatile memory continues to grow unabated.

Early flash memory devices had a single control signal that would control the input of both commands and addresses to the device. Over the years, improvements have made flash memory devices more versatile, leading to the "Open NAND Flash Interface Specification", Revision 1.0, Dec. 28, 2006. A flash memory device compliant with the Open NAND Flash Interface Specification, Revision 1.0, uses independent latch enable signals to control the input of, respectively, commands and addresses to the device.

There remains a need, however, for a solid state memory device that allows the system in which it is used to achieve higher storage capacities.

SUMMARY

According to a first aspect, there is provided a semiconductor memory device, comprising: memory; a plurality of inputs for receiving from a previous device a command latch enable signal, an address latch enable signal and an information signal; an input for receiving a select signal indicative of whether the memory device has been selected by a controller; a plurality of outputs for releasing a set of output signals towards a next device; control circuitry, wherein when the select signal is indicative of the memory device having been selected by the controller, the control circuitry is configured to interpret the information signal based on the command latch enable signal and the address latch enable signal; and bypass circuitry, wherein when the select signal is indicative of the memory device not having been selected by the controller, the bypass circuitry is configured to transfer the command latch enable signal, the address latch enable signal and the information signal to the outputs of the memory device.

According to a second aspect, there is provided a method, comprising: receiving a command latch enable signal, an address latch enable signal and an information signal at a memory device; receiving a select signal indicative of whether the memory device has been selected by a controller; interpreting the information signal based on the command latch enable signal and the address latch enable signal when the select signal is indicative of the memory device having been selected by the controller; and transferring the command latch enable signal, the address latch enable signal and the information signal to a neighboring device when the select signal is indicative of the memory device not having been selected by the controller.

According to a third aspect, there is provided a computer-readable storage medium comprising computer-readable instructions which, when processed, are used to impart to a semiconductor memory device functionality for: receiving a command latch enable signal an address latch enable signal and an information signal at a memory device; receiving a select signal indicative of whether the memory device has been selected by a controller; interpreting the information signal based on the command latch enable signal and the address latch enable signal when the select signal is indicative of the memory device having been selected by the controller; and transferring the command latch enable signal, the address latch enable signal and the information signal to a neighboring device when the select signal is indicative of the memory device not having been selected by the controller.

According to a fourth aspect, there is provided a semiconductor memory device, comprising: means for receiving a command latch enable signal, an address latch enable signal and an information signal; means for receiving a select signal indicative of whether the memory device has been selected by a controller; means for interpreting the information signal based on the command latch enable signal and the address latch enable signal when the select signal is indicative of the memory device having been selected by the controller; and means for transferring the command latch enable signal, the address latch enable signal and the information signal to a neighboring device when the select signal is indicative of the memory device not having been selected by the controller.

According to a fifth aspect, there is provided a point-to-point ring topology comprising a plurality of semiconductor memory devices, as well as a controller for communicating with the devices. The controller comprises a plurality of outputs for providing to a first one of the devices a command latch enable signal, an address latch enable signal and an information signal; a plurality of outputs for independently providing a respective select signal to each of the devices; control logic configured to select a particular one of the devices and to issue specific information to the particular one of the devices by controlling the command latch enable signal, the address latch enable signal and the information signal provided to the first device; and wherein the control logic is further configured to convey via the select signal independently provided to the particular one of the devices that the particular one of the devices has been selected while conveying via the select signals independently provided to the other devices that the other devices have not been selected.

According to a sixth aspect, there is provided a method, comprising: providing a command latch enable signal, an address latch enable signal and an information signal to a first device among a plurality of semiconductor memory devices arranged in a point-to-point ring topology; independently providing a respective select signal to each of the devices of the topology; selecting a particular one of the devices of the topology; issuing specific information to the particular one of the devices by controlling the command latch enable signal, the address latch enable signal and the information signal provided to the first device; conveying via the select signal independently provided to the particular one of the devices that the particular one of the devices has been selected; and conveying via the select signals independently provided to the other devices that the other devices have not been selected.

According to a seventh aspect, there is provided a computer-readable storage medium comprising computer-readable instructions which, when processed, are used to impart to a controller functionality for: providing a command latch enable signal, an address latch enable signal and an information signal to a first device among a plurality of semiconductor memory devices arranged in a point-to-point ring topology; independently providing a respective select signal to each of the devices of the topology; selecting a particular one of the devices of the topology; issuing specific information to the particular one of the devices by controlling the command latch enable signal, the address latch enable signal and the information signal provided to the first device; conveying via the select signal independently provided to the particular one of the devices that the particular one of the devices has been selected; and conveying via the select signals independently provided to the other devices that the other devices have not been selected.

According to an eighth aspect, there is provided a controller, comprising: means for providing a command latch enable signal, an address latch enable signal and an information signal to a first device among a plurality of semiconductor memory devices arranged in a point-to-point ring topology; means for independently providing a respective select signal to each of the devices of the topology; means for selecting a particular one of the devices of the topology; means for issuing specific information to the particular one of the devices by controlling the command latch enable signal, the address latch enable signal and the information signal provided to the first device; and means for conveying via the select signal independently provided to the particular one of the devices that the particular one of the devices has been selected; and means for conveying via the select signals independently provided to the other devices that the other devices have not been selected.

BRIEF DESCRIPTION OF THE DRAWINGS

FIG. 2 is a table showing a command structure of a plurality of commands that can be issued by the controller and interpreted by the memory devices of FIG. 1, in accordance with an example non-limiting embodiment.

DETAILED DESCRIPTION

Figure 1:
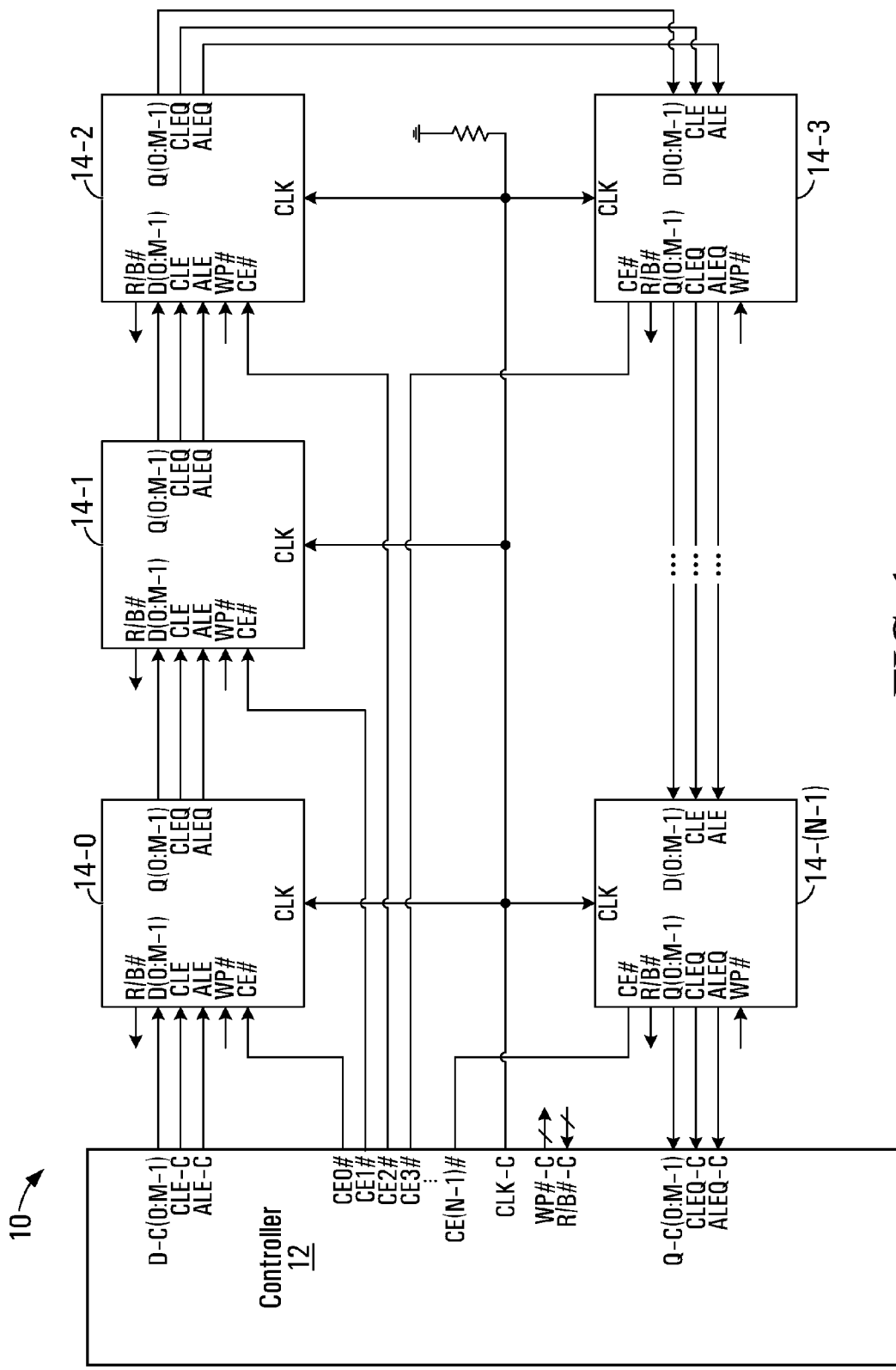
FIG. 1 is a block diagram of a plurality of memory devices connected to a controller in a point-to-point ring topology, in accordance with an example non-limiting embodiment.

FIG. 1 shows an example memory system 10 including a controller 12 in communication with a plurality of semiconductor memory devices 14-0, 14-1, . . . , 14-(N-1) arranged in a point-to-point ring topology. Specifically, the controller 12 is connected to memory device 14-0, which is connected to memory device 14-1, which is connected to memory device 14-2, and so on. Finally, memory device 14-(N-1) is connected back to the controller 12. In non-limiting example embodiments, the controller 12 and the memory devices 14-0, 14-1, . . . , 14-(N-1) may be implemented in a single multi-chip package (MCP) or as discrete units.

It should be appreciated that the system 10 may include any number of memory devices 14-0, 14-1, . . . , 14-(N-1). It should also be appreciated that different types of memory devices can be utilized as long as they have compatible interfaces. For example, the memory devices 14-0, 14-1, . . . , 14-(N-1) may all be of the same type (e.g., all having NAND Flash memory core), or they may be of different types (e.g., some having NAND Flash memory core and others having NOR Flash memory core). Other suitable possibilities will occur to those of skill in the art as being within the scope of example embodiments. Also, it should be appreciated that the memory devices 14-0, 14-1, . . . , 14-(N-1) may, in some examples, be at least substantially compliant with the flash standard described in "Open NAND Flash Interface Specification", Revision 2.0, Feb. 27, 2008, the contents of which are herein incorporated by reference.

The memory system 10 operates in a clock synchronous manner with respect to a device-external clock signal which may be distributed from the controller 12 in a number of ways, including in a multi-drop fashion, which is shown in FIG. 1 as a connection between a CLK-C output of the controller 12 to individual CLK inputs on the various memory devices 14-0, 14-1, . . . , 14-(N-1).

In addition, an address latch enable signal is daisy-chained from an ALE-C output of the controller 12 to an ALE input of memory device 14-0, then from an ALEQ output of memory device 14-0 to an ALE input of memory device 14-1, etc., and finally from an ALEQ output of memory device 14-(N-1) to an ALEQ-C input of the controller 12. Similarly, a command latch enable signal is daisy-chained from a CLE-C output of the controller 12 to a CLE input of memory device 14-0, then from a CLEQ output of memory device 14-0 to a CLE input of memory device 14-1, etc., and finally from a CLEQ output of memory device 14-(N-1) to a CLEQ-C input of the controller 12. The address latch enable signal and the command latch enable signal are synchronized with rising and/or falling edges of the device-external clock signal issued via the CLK-C output of the controller 12.

In addition, a synchronous M-bit wide data bus is daisy-chained from a set of D-C[0:M-1] outputs of the controller 12 to a respective set of D[0:M-1] inputs of memory device 14-0, then from a respective set of Q[0:M-1] outputs of memory device 14-0 to a respective set of D[0:M-1] inputs of memory device 14-1, etc., and finally from a set of Q[0:M-1] outputs of memory device 14-(N-1) to a respective set of Q-C[0:M-1] inputs of the controller 12. In various embodiments, M may be 1, 2, 4, 8, 16 or some other suitable value.

The data bus carries an information signal which, at different points in time, may convey command information, address information or data information. Whether the information signal conveys command information, address information or data information at a particular point in time is a function of the address latch enable signal and the command latch enable signal referred to above. This relationship will be described in further detail later on.

The controller 12 may also provide hardware write protection via a set of WP#-C outputs on the controller 12, each of which is connected to a respective WP# input on each of the memory devices 14-0, 14-1, . . . , 14-(N-1). The controller 12 may also enable device status monitoring via a set of R/B#-C inputs on the controller 12, each of which is connected to a respective R/B# output on each of the memory devices 14-0, 14-1, . . . , 14-(N-1). Of course, the controller 12 and the memory devices 14-0, 14-1, . . . , 14-(N-1) may include additional inputs and outputs for purposes such as power supply, connection to ground, etc., and which need not be described in detail because they are assumed to be known and understood by persons skilled in the art.

Generally speaking, the controller 12 comprises control logic/circuitry that is configured to issue command information, address information and data information to individual memory devices in the point-to-point ring topology. An individual memory device to which the controller 12 issues command information, address information or data information at a particular point in time can be referred to as a "target" device. In order to allow an individual one of the memory devices 14-0, 14-1, . . . , 14-(N-1) to be identified as the target device, the controller 12 provides a plurality of CEx# outputs, each of which is independently connected to a respective CE# input on each of the memory devices 14-0, 14-1, . . . , 14-(N-1).

Thus, in a specific non-limiting implementation, if the target device is, say, memory device 14-3, then the controller 12 causes the select signal at the CE3# output to go LOW while causing the select signals at the other CEx# to go HIGH. From the perspective of a particular one of the memory devices 14-0, 14-1, . . . , 14-(N-1), when the select signal at the CE# input of the particular memory device is LOW, this is indicative of the particular memory device having been selected by the controller 12 as the target device. On the other hand, when the select signal at the CE# input of the particular memory device is HIGH, this is indicative of the particular memory device not having been selected by the controller 12 as the target device.

In addition, in order to issue specific information (which can be command information, address information or data information) to the target device, the controller 12 not only sets the appropriate CEx# signal of the target device to LOW, as described earlier, but also encodes the specific information into the information signal placed on the D-C[0:M-1] outputs and, additionally, controls the latch enable signals on the CLE-C and ALE-C outputs in order to signal the presence of the specific information on the D-C[0:M-1] outputs. The specific manner of controlling the latch enable signals is now described.

In order to ensure effective communication among the devices in the system 10, the controller 12 and the memory devices 14-0, 14-1, . . . , 14-(N-1) abide by a communication protocol. According to the communication protocol, the controller 12 controls the latch enable signals on the CLE-C and ALE-C outputs in order to communicate with the memory devices 14-0, 14-1, . . . , 14-(N-1). Specifically, the controller 12 issues commands that have a certain command structure, shown in FIG. 2. In what follows, it is assumed that the select signal at the CEx# output leading to the target memory device is set to LOW, while the select signals at the other CEx# outputs are set to HIGH.

It will be observed that some commands, such as RESET and READ STATUS, use one cycle of the data bus, while other commands, such as PAGE READ, BLOCK ERASE and PAGE PROGRAM, use two cycles, namely one cycle for setup and the other cycle for execution. The controller 12 encodes the relevant command information into the information signal placed on the D-C[0:M-1] outputs, which are connected to the D[0:M-1] inputs of memory device 14-0. In order to identify the information signal on the D-C[0:M-1] outputs as command information, the controller 12 asserts the command latch enable signal issued via the CLE-C output (e.g., causes it to go HIGH) and de-asserts the address latch enable signal issued via the ALE-C output (e.g., causes it to go LOW). This is done in a synchronism with rising edges of the device-external clock signal issued via the CLK-C output.

It will also be observed that other commands, such as BLOCK ERASE, PAGE READ and PAGE PROGRAM, require at least one address cycle to follow a previous command cycle. Among the commands requiring addressing, some commands (such as PAGE READ and PAGE PROGRAM) use five address cycles, namely two cycles for the column address and three cycles for the row address. Other commands requiring addressing (such as BLOCK ERASE) use the aforementioned three address cycles for the row address but do not provide a column address. The controller 12 encodes the relevant address information into the information signal placed on the D-C[0:M-1] outputs, which are connected to the D[0:M-1] inputs of memory device 14-0. In order to identify the information signal on the D-C[0:M-1] outputs as address information, the controller 12 de-asserts the command latch enable signal issued via the CLE-C output (e.g., causes it to go LOW) and asserts the address latch enable signal issued via the ALE-C output (e.g., causes it to go HIGH). This is done in a synchronism with rising edges of the device-external clock signal issued via the CLK-C output.

It will also be observed that still other commands, such as PAGE PROGRAM, require the transmittal of data words to the target memory device following a previous command cycle. Accordingly, the controller 12 encodes the appropriate data information into the information signal placed on the D-C[0:M-1] outputs, which are connected to the D[0:M-1] inputs of memory device 14-0. In order to identify the information signal on the D-C[0:M-1] outputs as data information, the controller 12 asserts both the command latch enable signal issued via the CLE-C output and the address latch enable signal issued via the ALE-C output (causes them to go HIGH). This is done in a synchronism with rising edges of the device-external clock signal issued via the CLK-C output.

Finally, it will be observed that some commands, such as PAGE READ, include a prompt to elicit read data without any concern for the information signal provided on the D-C[0:M-1] outputs. The prompt is expected to follow a previous command cycle after a delay that corresponds to an amount of time required by the target device to extract the read data from memory. In order to issue the prompt to elicit read data, the controller 12 asserts both the command latch enable signal issued via the CLE-C output and the address latch enable signal issued via the ALE-C output (e.g., causes them to go HIGH). This is done in a synchronism with rising edges of the device-external clock signal issued via the CLK-C output, following the aforesaid amount of time required by the target device to extract the read data from memory.

It is noted from the above that asserting both the command latch enable signal (issued via the CLE-C output) and the address latch enable signal (issued via the ALE-C output) can have a different significance, depending on whether the command issued by the controller 12 was a PAGE PROGRAM command or a PAGE READ command. Specifically, if the command issued by the controller 12 was a PAGE PROGRAM command, then asserting the latch enable signals indicates the presence of write data on the D[0:M-1] inputs, while if the command issued by the controller 12 was a PAGE READ command, then the asserting the latch enable signals indicates a prompt to elicit read data from memory device 14-0.

Optionally, to assist the memory devices 14-0, 14-1, ..., 14-(N-1) in discriminating between write data and a prompt to elicit read data, the controller 12 may provide a set of optional RE#-C outputs (not shown), each of which is connected to a respective RE# input (not shown) on each of the memory devices 14-0, 14-1, ..., 14-(N-1). The RE#-C outputs convey a plurality of mode signals individually destined for the memory devices 14-0, 14-1, ..., 14-(N-1). For example, setting the mode signal provided to memory device 14-0 to LOW could be used to request that memory device 14-0 go into a "write mode", whereby upon recognizing that the latch enable signals have been asserted, memory device 14-0 will be alerted to the presence of write data on the D[0:M-1] inputs. Conversely, setting the mode signal provided to memory device 14-0 to HIGH could be used to request that memory device 14-0 go into a "read mode", whereby upon recognizing that the latch enable signals have been asserted, memory device 14-0 will establish that it has received a prompt to elicit read data from the memory cell array 302.

Consider now the case where, in operation, the controller 12 has indeed issued specific information (which can be command information, address information or data information) to a target device in accordance with the communication protocol described above. It will be recalled that the controller 12 will have set the appropriate CEx# signal of the target device to LOW, and will have encoded the specific information into the information signal placed on the D-C[0:M-1] outputs and, additionally, will have appropriately controlled the latch enable signals on the CLE-C and ALE-C outputs in order to signal the presence of the specific information on the D-C[0:M-1] outputs.

The information signal on the D-C[0:M-1] outputs and the latch enable signals on the CLE-C and ALE-C outputs travel to memory device 14-0. However, while memory device 14-0 may in some cases be the target device, in other cases it will not be the target device. Indeed, the behavior of memory device 14-0 is fundamentally different, depending on whether or not it was selected by the controller 12 as the target memory device. This behavioral difference will be described in greater detail after first describing the configuration of memory device 14-0, which is representative of any of the memory devices 14-0, 14-1, ..., 14-(N-1) in the system 10.

Figure 3:
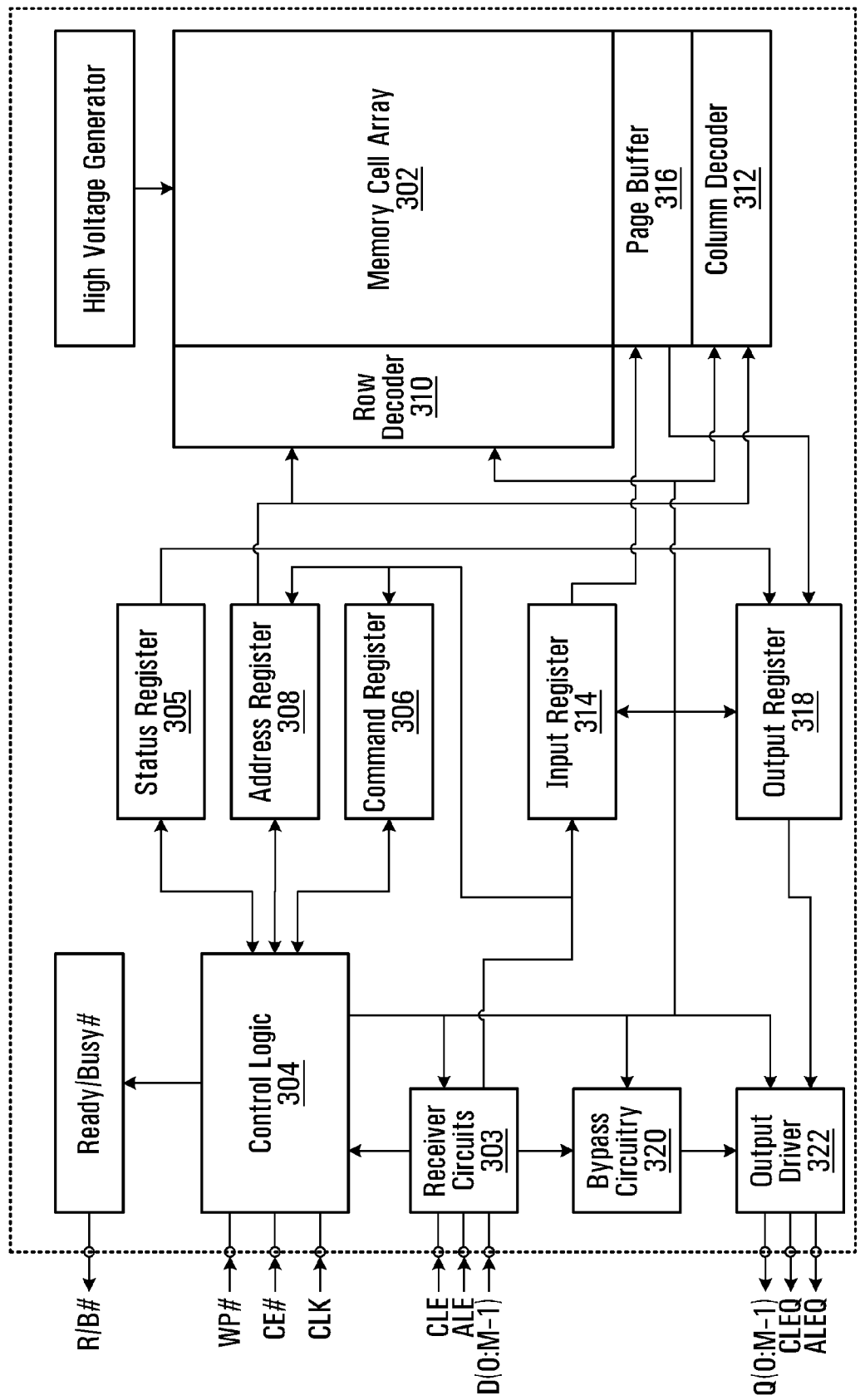
FIG. 3 is a functional block diagram of one of the memory devices in FIG. 1, in accordance with an example non-limiting embodiment.

With additional reference to FIG. 3, memory device 14-0 comprises a memory core, which can comprise a memory cell array 302. In a specific non-limiting embodiment, the memory cell array 302 is arranged into two planes, each plane consisting of 2,048 blocks. Also in a specific non-limiting embodiment, each block is subdivided into 64 programmable pages. Also in a specific non-limiting embodiment, each page consists of 2,112 bytes. Also in a specific non-limiting embodiment, the pages are further divided into a 2,048-byte data storage region with a separate 64-byte area, with the 64-byte area being used for error management functions as commonly known in the art. The memory cell array 302 can be programmed and read on a per-page basis and is erased on a per-block basis.

Memory device 14-0 comprises input receiver circuits 303 for receiving the information signal on the D[0:M-1] inputs.

Memory device 14-0 also comprises a status register 305 for reporting the operational status of memory device 14-0.

Memory device 14-0 further comprises control logic/circuitry 304, which controls and manages overall operation of memory device 14-0 according to a control algorithm. The control algorithm is sensitive to whether the select signal at the CE# input is LOW or HIGH, namely, whether or not memory device 14-0 has been selected by the controller 12 as being the target device at a given point in time.

Indeed, when the select signal at the CE# input is LOW (i.e., memory device 14-0 has been selected by the controller 12 as the target device), then the control logic 304 is configured to enable the following behavior:

If the command latch enable signal on the CLE input is asserted (e.g., set to HIGH) and the address latch enable signal on the ALE input is de-asserted (e.g., set to LOW), then information on the D[0:M-1] inputs is captured by the input receiver circuits 303, latched by a command register 306 and transferred to the control logic 304. The control logic 304 considers the information as command information and generates internal signals to control device operations. During this time, the signals on the CLEQ and ALEQ outputs are de-asserted (e.g., set to LOW), while the previous state of the signal on the Q[0:M-1] outputs is preserved.

If the command latch enable signal on the CLE input is de-asserted (e.g., set to LOW) and the address latch enable signal on the ALE input is asserted (e.g., set to HIGH)—for the case where certain specific command cycles have been previously received, then information on the D[0:M-1] inputs is captured by the input receiver circuits 303 and latched by an address register 308. The control logic 304 considers the information as address information and sends it to a row decoder 310 or a column decoder 312 to select, respectively, a row address or a column address for the memory cell array 302. During this time, the signals on the CLEQ and ALEQ outputs are de-asserted (e.g., set to LOW), while the previous state of the signal on the Q[0:M-1] outputs is preserved.

If the command latch enable signal on the CLE input is asserted and the address latch enable signal on the ALE input is also asserted, for certain commands, then the following two possibilities exist:

a) If memory device 14-0 is in write mode, then information on the D[0:M-1] inputs is captured by the input receiver circuits 303 and latched by an input register 314. This information is transferred to the memory cell array 302, on a per-2,112-byte page basis, through a page buffer 316. During this time, the signals on the CLEQ and ALEQ outputs are de-asserted (e.g., set to LOW), while the previous state of the signal on the Q[0:M-1] outputs is preserved.

b) If memory device 14-0 is in read mode, then information is transferred from the memory cell array 302, on a per-page basis, through the page buffer 316 and loaded into an output register 318 for placement on the Q[0:M-1] outputs via an output driver 322. During this time, the asserted (e.g., HIGH) state of the latch enable signals at the CLE and ALE inputs is echoed on the CLEQ and ALEQ outputs. The signals on the CLEQ, ALEQ and Q[0:M-1] outputs are referenced to the rising edges of a device-internal clock signal. In some non-limiting embodiments, a clock recovery circuit (not shown) may be used for deriving the device-internal clock signal from the device-external clock signal (at the CLK input). The clock recovery circuit, if used, may include circuit components in a feedback loop configuration, such as a phase locked loop or a delay locked loop.

Turning now to the case where the select signal at the CE# input is HIGH (i.e., memory device 14-0 is not the target device), then the control logic 304 is configured to enable "bypass" (or "flow-through") behavior. Specifically, bypass circuitry 320 is operative to transfer the command latch enable signal on the CLE input over to the CLEQ output. The bypass circuitry 320 is also configured to transfer the address latch enable signal on the ALE input over to the ALEQ output. Finally, the bypass circuitry 320 is configured to transfer the information captured by the input receiver circuits 303 from the D[0:M-1] inputs over to the Q[0:M-1] outputs. Memory device thus bypasses (or "flows through" or "echoes") any incoming signal transitions from the D[0:M-1] input, the ALE input and the CLE input over to the Q[0:M-1] outputs, the ALEQ output and CLEQ output, respectively.

The bypass, flow-through or echo operation is done in a source-synchronous manner relative to the aforementioned device-internal clock signal (which, optionally, may be obtained from the clock recovery circuit in some embodiments), with a predetermined delay in number of clock cycle(s), referred to as a "flow-through latency" or "input-to-output latency" and denoted $t_{IOL}$. The synchronous relationship of the signals at the outputs ensures proper set-up and hold time at the next neighboring device in the system 10.

It should thus be appreciated that if the target memory device is 14-T, then all memory devices 14-x where x<T will echo the signals received from the controller 12, while all memory devices 14-x with x>T will echo the signals received from the target memory device 14-T. For its part, the target memory device 14-T will respond to the information received from the controller 12 via memory devices 14-x (for x<T) in the manner described above. It should be appreciated that each memory device introduces additional clock cycle latency along the point-to-point ring. Therefore, the number of interconnected devices determines the total input-to-output latency of operations. This can assist the controller 12 in determining the start and end of valid read data on the Q-C [0:M-1] inputs received from memory device 14-(N-1). However, by connecting the CLEQ and ALEQ outputs of memory device 14-(N-1) to the CLEQ-C and ALEQ-C inputs of the controller 12, the controller 12 is provided with more precise knowledge of the start and end of valid read data on the Q-C[0:M-1] inputs without counting the clock latency according to the number of devices in the system 10.

It also should be appreciated that by virtue of synchronizing the signals on the Q[0:M-1] outputs of each memory device with the transitions of the respective device-internal clock signal derived from the respective device-external cock signal at the respective CLK input, the memory system 10 can provide SDR (Single Data Rate), DDR (Double Data Rate) or QDR (Quadruple Data Rate) operation in various non-limiting embodiments. This could make flow-through latency as small as a half clock cycle or a quarter clock cycle. In addition, the memory system 10 can be implemented using differential clock signals in order to achieve more accurate clock cycle timing in high speed applications. In the same manner, the signals on the ALE, CLE and D[0:M-1] inputs, as well as the ALEQ, CLEQ and Q[0:M-1] outputs, can be differential signals if desired or beneficial.

The following provides a detailed description of specific non-limiting examples of individual commands issued by the controller 12 and the manner in which the target memory device (say 14-3) behaves upon receipt of such commands.

Page Read

Figure 4:
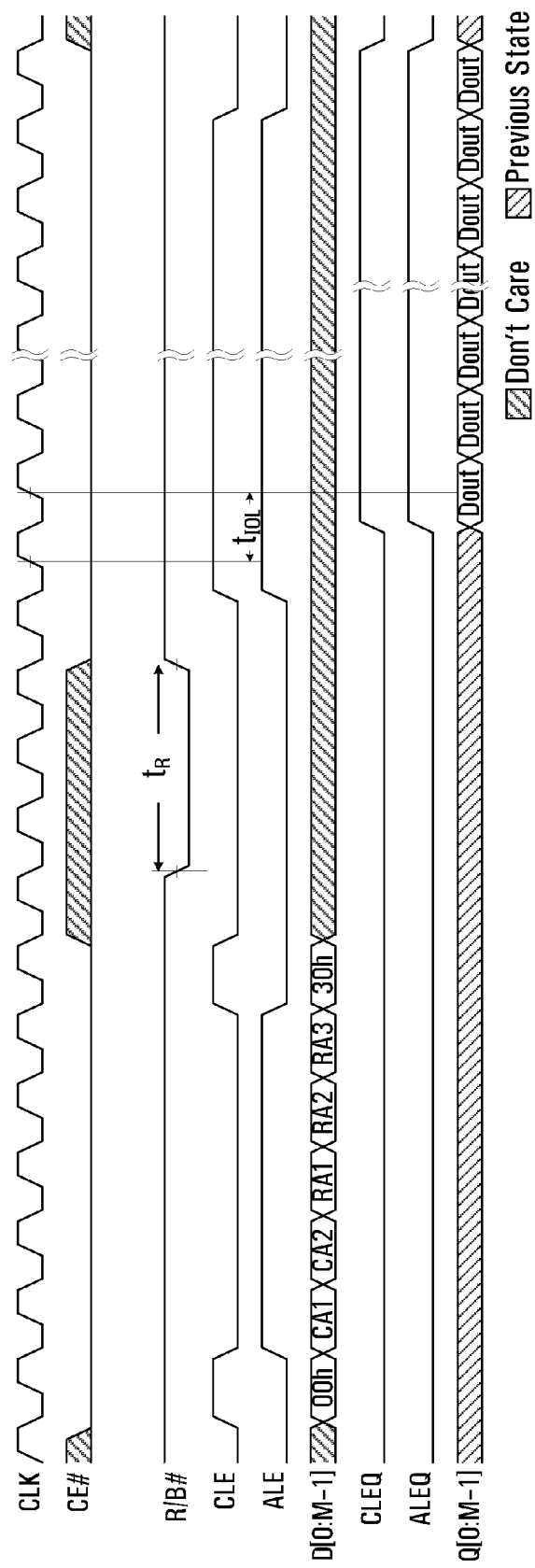
FIG. 4 is a timing diagram illustrative of a PAGE READ command, in accordance with an example non-limiting embodiment.

With reference to FIG. 4, the PAGE READ command includes a first command cycle (in this example: the 00h command code), five address cycles, and a second command cycle (in this example: the 30h command code). The target memory device 14-3 responds by transferring the page of data at the given address in the memory cell array 302 to the page buffer 316 while keeping the signal at the R/B# to LOW for the page read time period, denoted $t_R$. The signal at the R/B# transitions to HIGH after the page transfer is complete.

At this point, data in the page buffer 316 is output by the target memory device 14-3 after receipt of a prompt from the controller 12. Specifically, after the read time period ($t_R$) has elapsed, the controller 12 asserts the command latch enable signal and the address latch enable signal (e.g., sets them to HIGH) while setting the select signal CE3# to LOW. In response, the target memory device 14-3 transmits read data through the Q[0:M-1] outputs with, an input-to-output latency of $t_{IOL}$ and referenced to the rising edge of the device-internal clock signal derived from the device-external clock signal at the CLK input. The read operation starts from the initial column address and goes to the end of the page, with the column address being automatically increased in the process. In addition, the target memory device 14-3 echoes the command latch enable signal (received at the CLE input) and the address latch enable signal (received at the ALE input) over to the CLEQ and ALEQ outputs, respectively, with the same input-to-output latency $t_{IOL}$ as the read data on the Q[0:M-1] outputs.

Random Data Output

Figure 5:
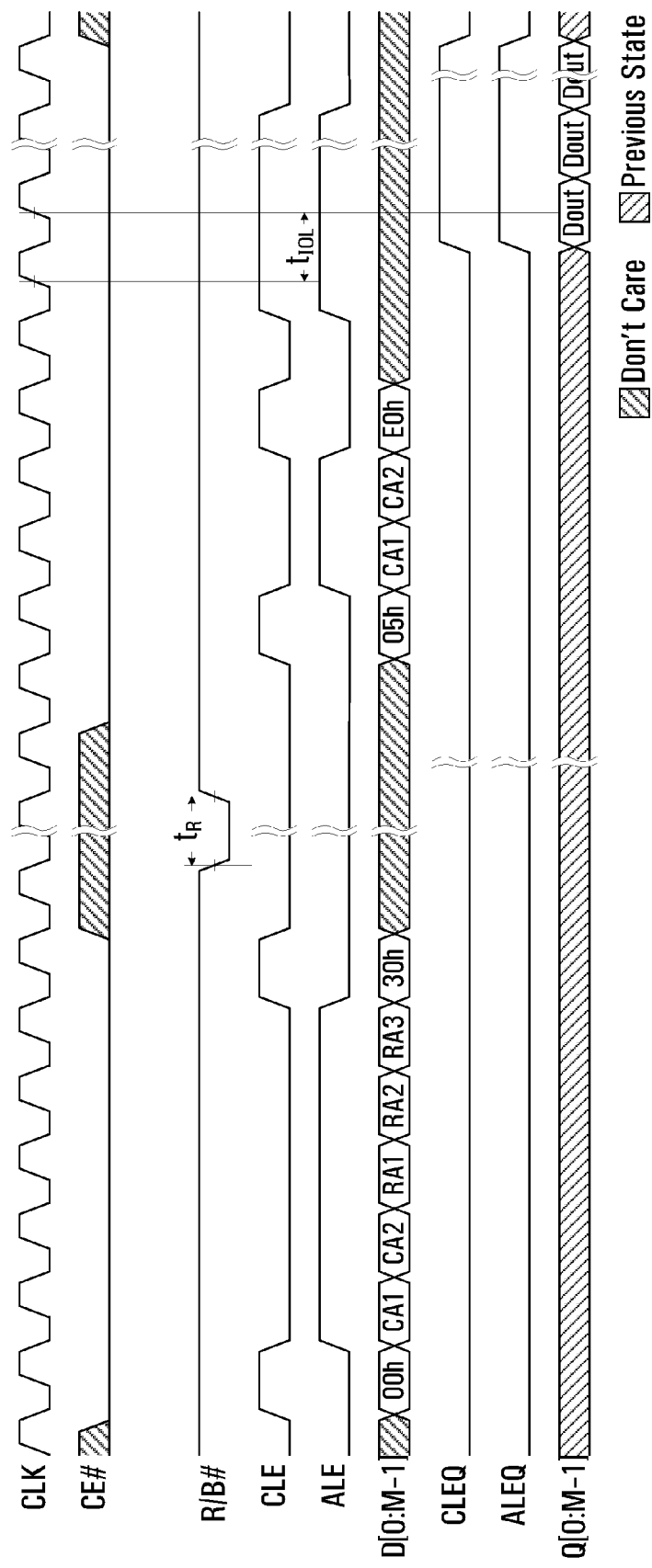
FIG. 5 is a timing diagram illustrative of a RANDOM DATA OUTPUT command, in accordance with an example non-limiting embodiment.

With reference to FIG. 5, the RANDOM DATA OUTPUT command enables the controller 12 to specify a new column address so the data at single or multiple addresses can be read. The RANDOM DATA OUTPUT command is enabled after having executed a PAGE READ command as described above. Data at a desired column address can be elicited by issuing a first command cycle (in this example: the 05h command code), two address cycles specifying the desired column address, and a second command cycle (in this example: the E0h command code).

Page Program

Figure 6:
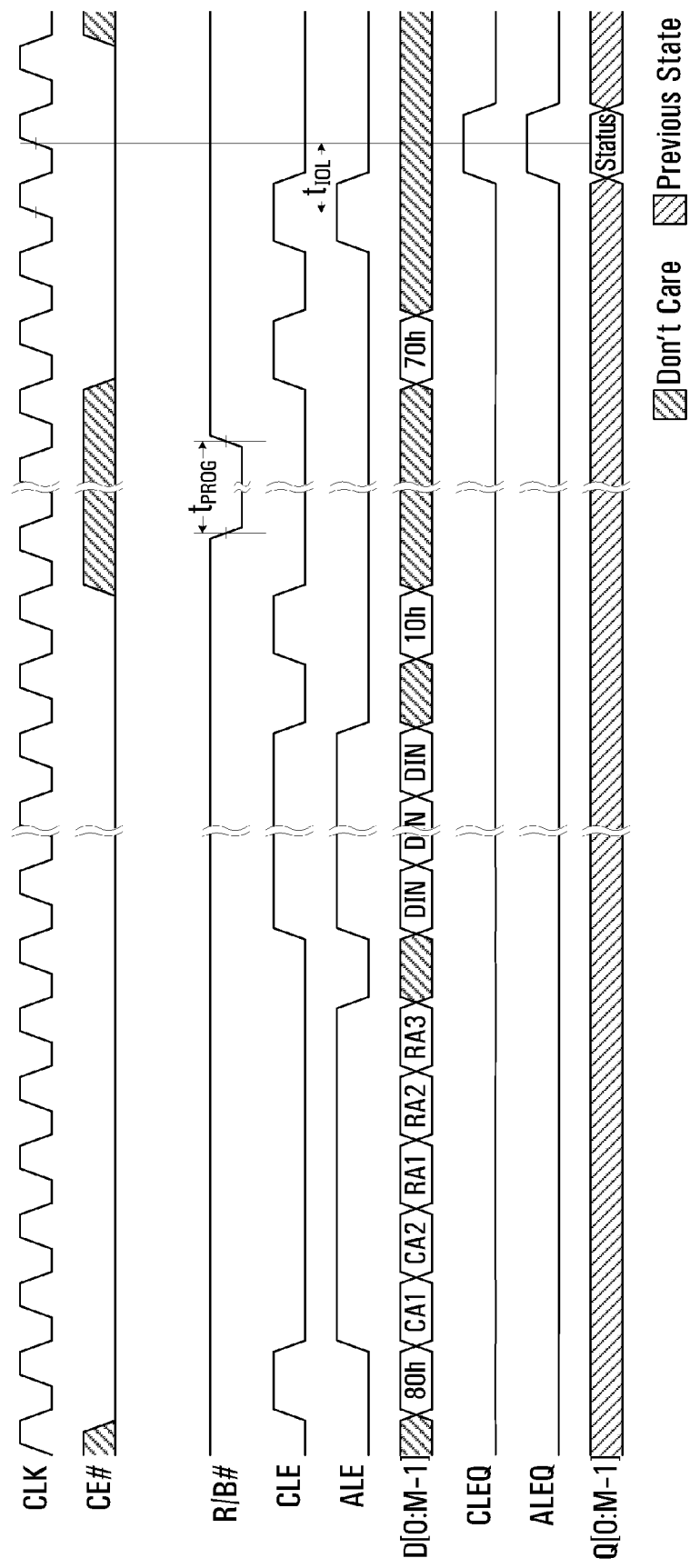
FIG. 6 is a timing diagram illustrative of a PAGE PROGRAM command, in accordance with an example non-limiting embodiment.

With reference to FIG. 6, the PAGE PROGRAM command includes a first command cycle (in this example: the 80h command code), five address cycles (specifying a given address), the data to be written (on consecutive clock cycles starting at the given address), and a second command cycle (in this example: the 10h command code). The second command cycle initiates a non-volatile programming process where the loaded data is programmed into the appropriate cells of the page that starts at the given address. This process lasts for a program time period, denoted $t_{PROG}$. An internal program state controller can automatically execute the algorithms and timings necessary for programming and verification, thereby freeing the controller 12 for other tasks.

Random Data Input

Figure 7:
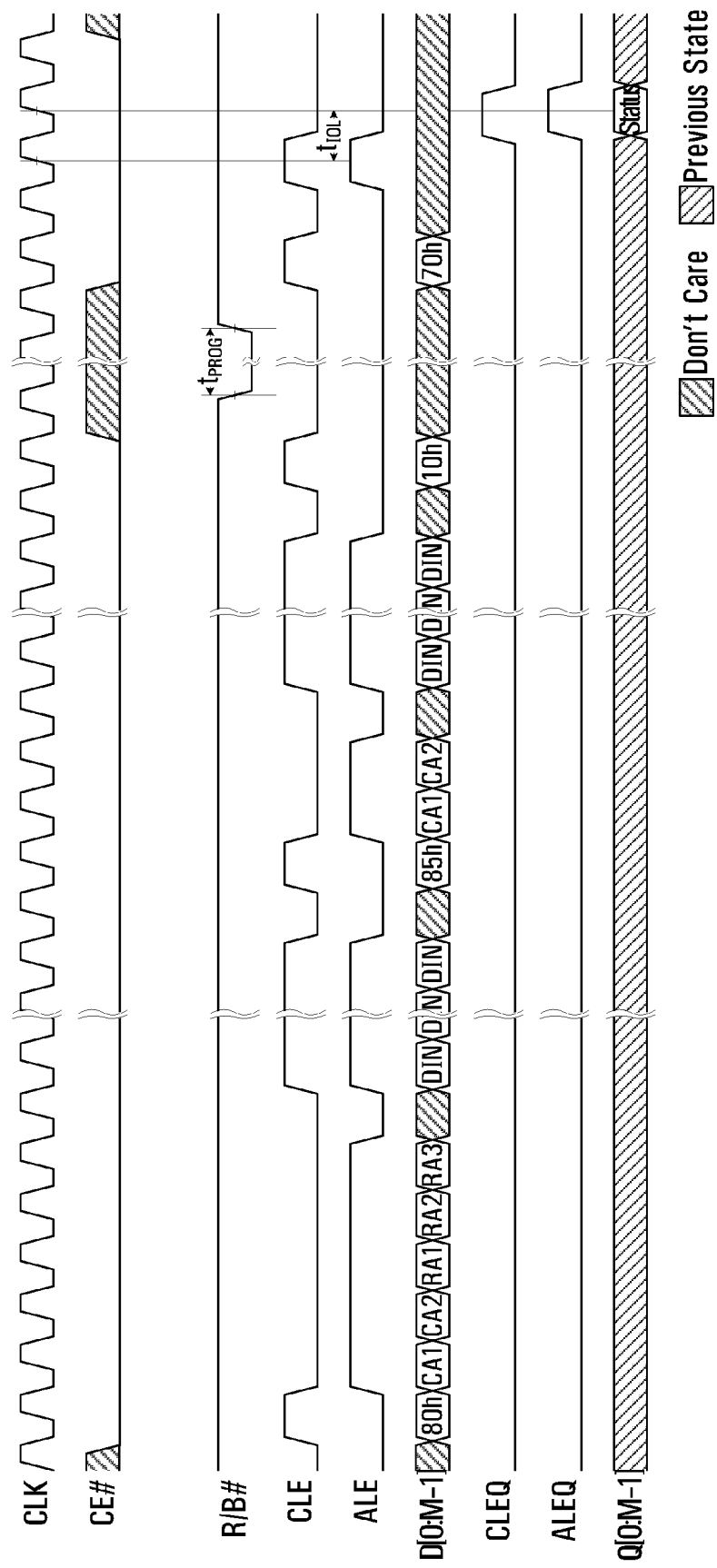
FIG. 7 is a timing diagram illustrative a RANDOM DATA INPUT command, in accordance with an example non-limiting embodiment.

With reference to FIG. 7, the RANDOM DATA INPUT command can be issued just prior to issuing the second command cycle of the PAGE PROGRAM command, in order to modify the data to be written to a particular column address.

Accordingly, once the data to be written has been entered in the context of a PAGE PROGRAM command as described above, the controller 12 issues a command cycle (in this example: the 85h command code), two address cycles (specifying a given column address) and the data to be written. Following this, the second command cycle of the PAGE PROGRAM command (in this example: the 10h command code) can be issued in order to trigger the aforementioned programming operation of duration $t_{PROG}$.

Block Erase

Figure 8:
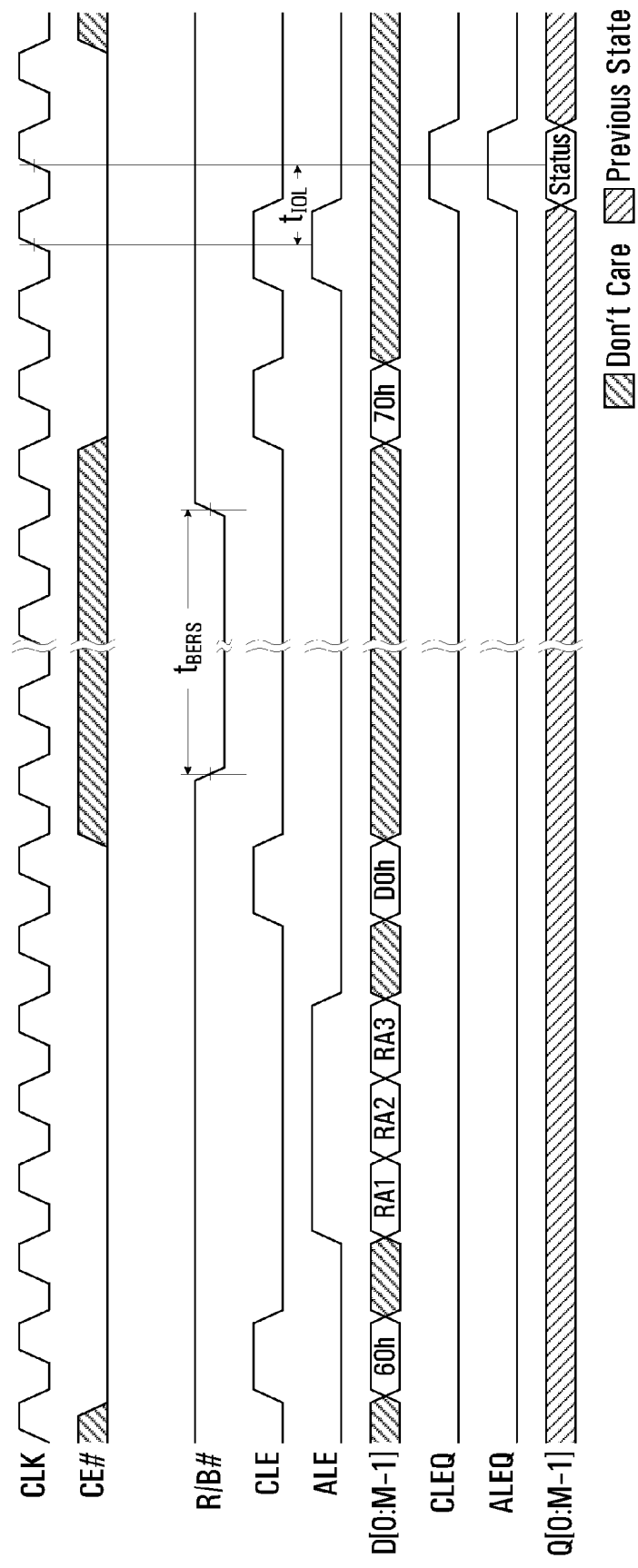
FIG. 8 is a timing diagram illustrative of a BLOCK ERASE command, in accordance with an example non-limiting embodiment.

Erasure of the cells in the memory cell array 302 is done on a per-block basis. With reference to FIG. 8, the BLOCK ERASE command includes a first command cycle (in this example: the 60h command code), three address cycles and a second command cycle (in this example: the D0h command code). It is noted that where there are 4,096 erasable blocks, only twelve (12) bits are required to specify the block needing to be eased. Thus, where more than 12 bits are loaded in the three address cycles, the remaining bits can be ignored. The second command cycle initiates an internal erasing process, which is followed by an internal verification process, lasting for a block erase time period, denoted $t_{BERS}$.

It should be appreciated that the use of a two-step sequence (i.e., first and second command cycles) ensures that memory contents are not accidentally erased due to external noise conditions.

Reset

Figure 9:
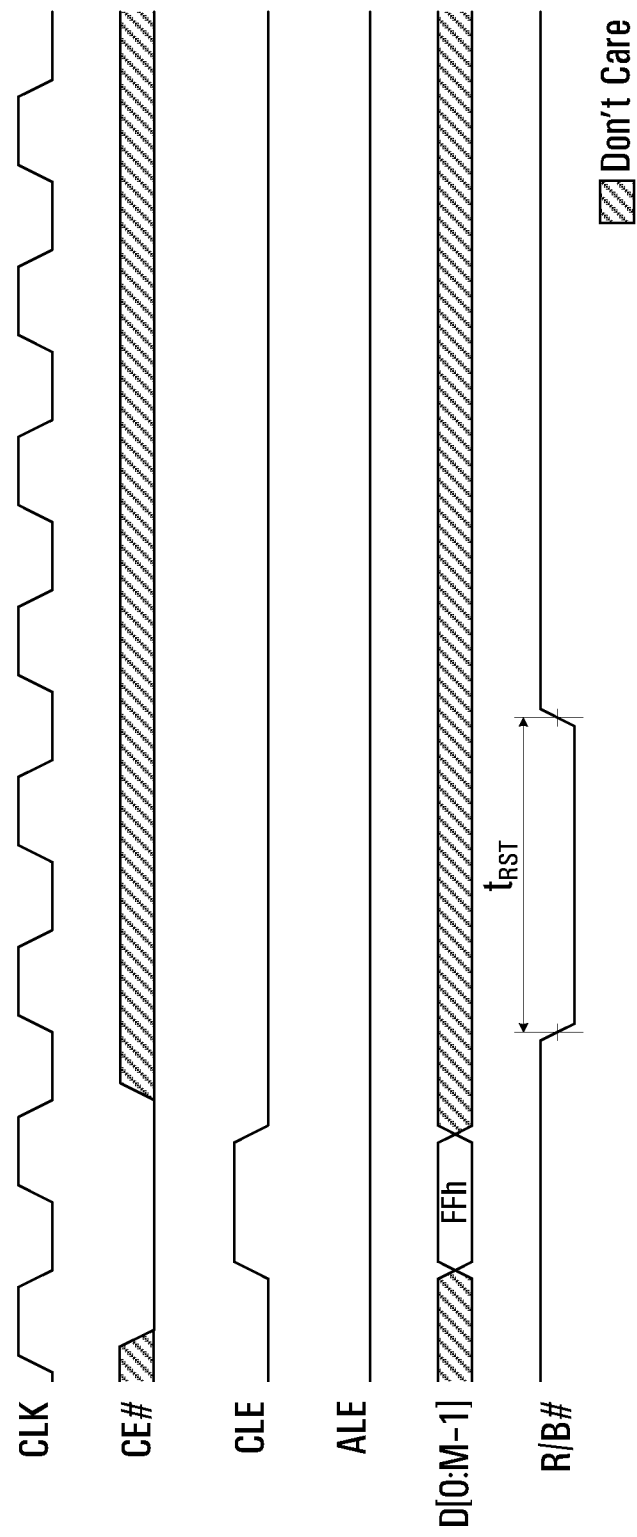
FIG. 9 is a timing diagram illustrative of a RESET command, in accordance with an example non-limiting embodiment.

With reference to FIG. 9, the RESET command includes a single command cycle (in this example: the FFh command code). The RESET command places the target memory device 14-3 into a known condition and to abort a device operation in progress. Specifically, PAGE READ, PAGE PROGRAM, and BLOCK ERASE operations can be aborted while the target memory device 14-3 is busy performing those operations. For example, in the case of a PAGE PROGRAM or BLOCK ERASE operation, the internally generated voltage is discharged to 0 volts and the target memory device 14-3 enters stand-by status waiting for a new command after a specified reset time, denoted $t_{RST}$. The contents of the page location being programmed or the block being erased are no longer valid, as the data will be partially programmed or erased. The command register 306 is cleared and is ready for the next command.

Read Status

Figure 10:
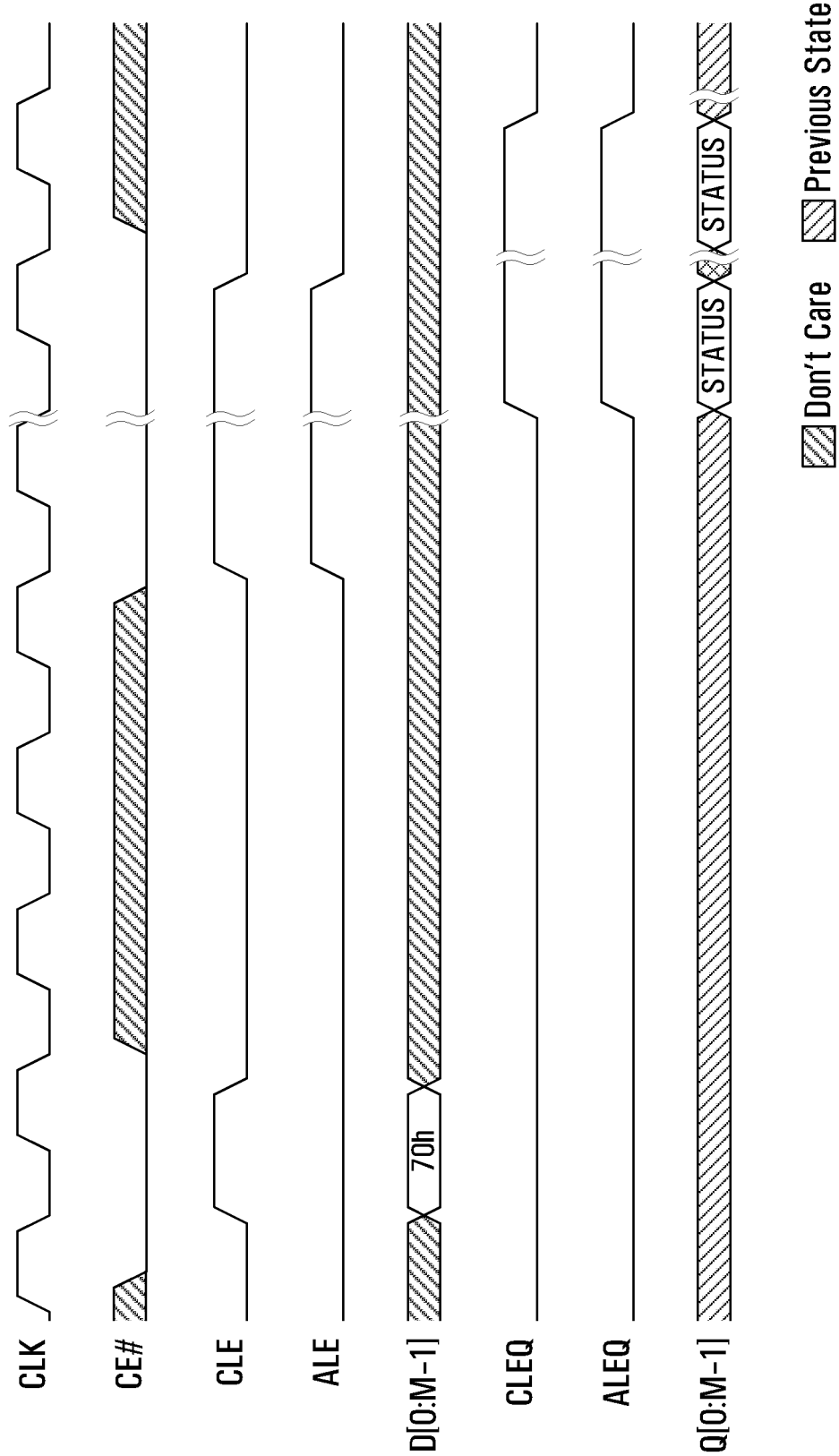
FIG. 10 is a timing diagram illustrative of a READ STATUS command, in accordance with an example non-limiting embodiment.

The status register 305 is readable by the control logic 304 during device operation. With reference to FIG. 10, the READ STATUS command includes a single command cycle (in this example: the 70h command code). After the READ STATUS command is issued, the control logic 304 places the contents of the status register 305 on the Q[0:M-1] outputs until a new valid command is written to the command register 306. Meanwhile, changes in the status register 305 will be reflected on the Q[0:M-1] outputs as long as the command latch enable signal and the address latch enable signal (i.e., at the CLE and ALE inputs, respectively) are asserted (e.g., set to HIGH) while the select signal (at the CE# input) is LOW; it is not necessary to start a new READ STATUS cycle to see these changes.

With reference back to FIG. 4, the READ STATUS command can be issued to determine the progress of the page transfer from the memory cell array 302 to the page buffer 316 during a PAGE READ command. If the controller 12 issues the READ STATUS command before issuing a prompt to elicit the read data (by asserting the latch enable signals), then in order to revert back to the read operation, the controller 12 reissues the second command cycle of the PAGE READ command (in this example: the 00h command code). Subsequently asserting both the command latch enable signal and the address latch enable signal (e.g., setting them to HIGH) will result in data being output by the target memory device 14-3, starting at the initial column address specified earlier in the PAGE READ command.

With reference back to FIG. 6, the READ STATUS command can also be issued to determine the progress of the PAGE PROGRAM command. Alternatively, the controller can monitor the R/B# output of the target memory device 14-3, received via the appropriate R/B#-C input at the controller 12.

With reference back to FIG. 8, the READ STATUS command can also be issued to check the status of the BLOCK ERASE operation.

With reference again to FIG. 9, the READ STATUS command can also be issued to check the status of the RESET command. Alternatively, the controller 12 can wait until the specified reset time $t_{RST}$ has elapsed before resuming normal operation.

Figure 11:
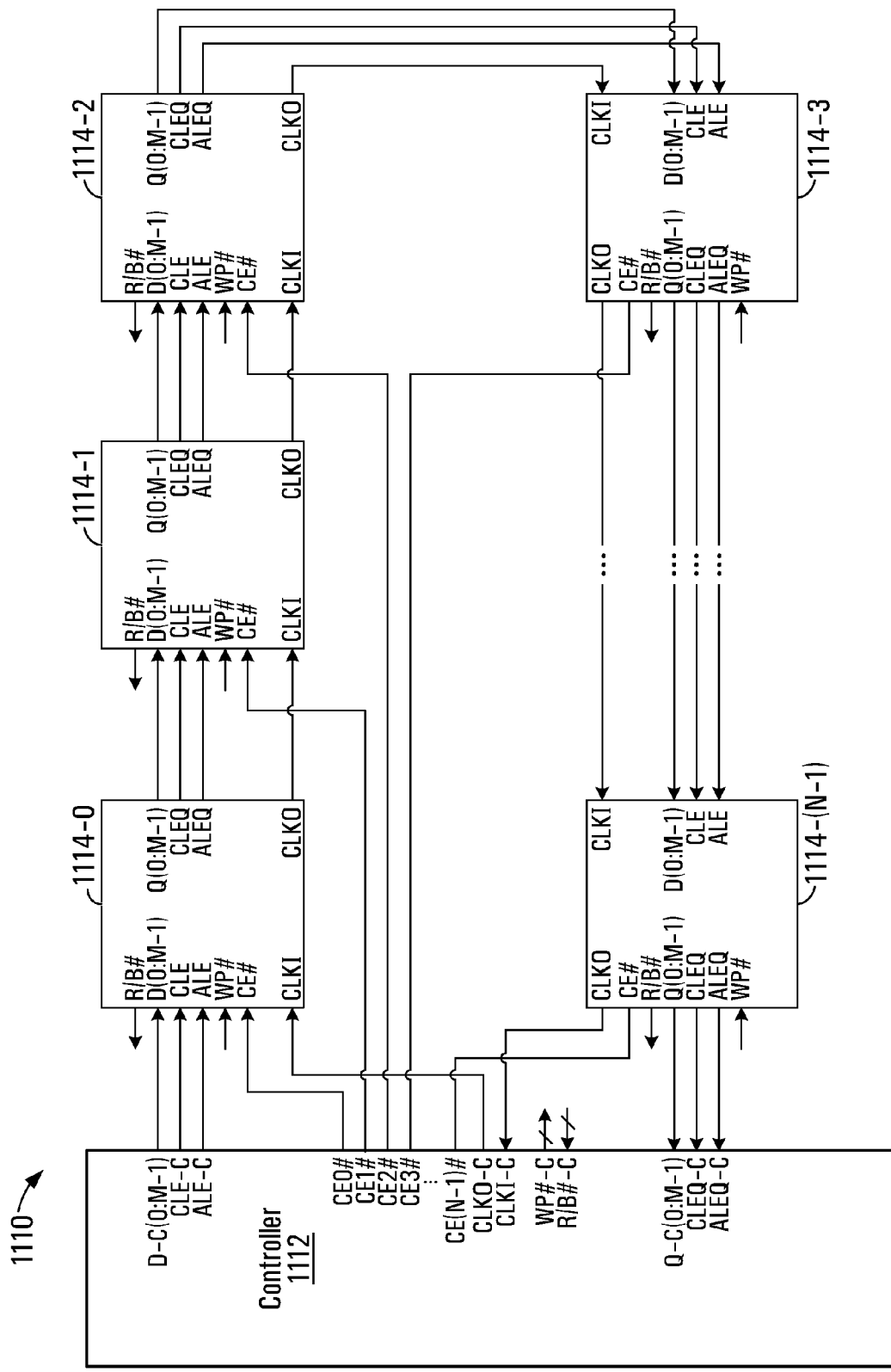
FIG. 11 is a block diagram of a plurality of memory devices connected to a controller in a point-to-point ring topology, in accordance with another non-limiting embodiment.

With reference now to FIG. 11, there is shown an alternative example memory system 1110 including a controller 1112 in communication with a plurality of semiconductor memory devices 1114-0, 1114-1, . . . , 1114-(N-1) arranged in a point-to-point ring topology. The system 1110 (in FIG. 12) is similar to the system 10 (in FIG. 1), except that the manner in which the controller 1112 distributes a clock signal to the memory devices 1114-0, 1114-1, . . . , 1114-(N-1) differs. Specifically, the controller 1112 distributes the clock signal in a cascading fashion, shown as a daisy-chain connection from a CLKO-C output of the controller 1112 to a CLKI input of memory device 1114-0, then from a CLKO output of memory device 1114-0 to a CLKI input of memory device 1114-1, etc., and finally from a CLKO output of memory device 1114-(N-1) to a CLKI-C input of the controller 1112. In this topology, therefore, each of the memory devices 1114-0, 1114-1, . . . , 1114-(N-1) includes a CLKI input port for receiving a clock signal from a previous device and a CLKO output for providing a clock signal to a neighboring device. For the illustrated non-limiting embodiment, in the case of memory device 1114-0, the previous device is the controller 1112 and the neighboring device is memory device 1114-1; in the case of memory device 1114-x (1<x<N-1), the previous device is memory device 1114-(x-1) and the neighboring device is memory device 1114-(x+1); and in the case of memory device 1114-(N-1), the previous device is memory device 1114-(N-2) and the neighboring device is the controller 1112.

By virtue of the cascaded nature of the clock signal distribution, the clock signal received at the CLKI input of even the most distant (relative to the controller 1112) memory device will be properly synchronized with the signals arriving on the other inputs (e.g., the command latch enable signal, the address latch enable signal, the information signal) of the memory device. This allows a virtually unlimited number of memory devices 1114-0, 1114-1, . . . , 1114-(N-1) to be interconnected in the topology without sacrificing signal integrity, thus providing superior memory expandability for SSD (Solid State Drive) mass storage applications.

Thus, non-limiting example embodiments of an improved semiconductor memory device has been described and illustrated.

Those skilled in the art will appreciate that in some embodiments, the memory devices 14-0, 14-1, . . . , 14-(N-1), as well as the memory devices 1114-0, 1114-1, . . . , 1114-(N-1), can be imparted with their respective functionality at least partly through the use of a software program that is run on a computer. Such a software program could be encoded as computer-readable instructions on a computer-readable storage medium, the instructions being designed to produce low-level circuit diagrams and/or integrated circuit configurations for achieving the above describe functionality.

Certain adaptations and modifications of the described embodiments can be made. Therefore, the above discussed embodiments are considered to be illustrative and not restrictive.

The invention claimed is:

1. A system, comprising:
   a point-to-point ring topology comprising a plurality of semiconductor memory devices; and
   a controller for communicating with the devices, said controller comprising:
      a plurality of outputs for providing to a first one of the devices a command latch enable signal, an address latch enable signal and an information signal;
      a plurality of outputs for independently providing a respective select signal to each of the devices;
      control logic configured to select a particular one of the devices and to issue specific information to the particular one of the devices by controlling the command latch enable signal, the address latch enable signal and the information signal provided to the first device, wherein when the particular one of the devices is not the first one of the devices, the command latch enable signal, the address latch enable signal and the information signal are daisy-chained from the first one of the devices to the particular one of the devices via the point-to-point ring topology; and
      wherein the control logic is further configured to convey via the select signal independently provided to the particular one of the devices that the particular one of the devices has been selected while conveying via the select signals independently provided to the other devices that the other devices have not been selected.

2. The system defined in claim 1, wherein the specific information comprises a command cycle forming part of a command.

3. The system defined in claim 2, wherein the command is one of a PAGE READ command, a RANDOM DATA OUTPUT command, a PAGE PROGRAM command, a RANDOM DATA INPUT command, a BLOCK ERASE command, a RESET command and a READ STATUS command.

4. The system defined in claim 2, wherein to issue the specific information, the control logic is configured to assert the command latch enable signal, to de-assert the address latch enable signal and to encode the command cycle into the information signal.

5. The system defined in claim 1, wherein the specific information comprises an address cycle forming part of an address.

6. The system defined in claim 5, wherein to issue the specific information, the control logic is configured to de-assert the command latch enable signal, to assert the address latch enable signal and to encode the address cycle into the information signal.

7. The system defined in claim 1, wherein the specific information comprises data to be written to the particular one of the devices following issuance of a command to write data to the particular one of the devices.

8. The system defined in claim 7, wherein to issue the specific information, the control logic is configured to assert both the command latch enable signal and the address latch enable signal and to sequentially place onto the information signal portions of the data to be written to the particular one of the devices.

9. The system defined in claim 8, wherein the controller further comprises an output for providing a mode signal to the particular one of the devices, wherein the control logic is further configured to convey, via the mode signal and during issuance of the data to be written to the particular one of the devices, a request that the particular one of the devices operate in a write mode.

10. The system defined in claim 1, wherein the control logic is further configured to issue a prompt to retrieve data from the particular one of the devices by controlling the command latch enable signal and the address latch enable signal following issuance of a read command to read data from the particular one of the devices.

11. The system defined in claim 10, wherein to issue the prompt, the control logic is configured to assert both the command latch enable signal and the address latch enable signal after a read time period has elapsed following issuance of the read command to read data from the particular one of the devices.

12. The system defined in claim 11, the controller further comprising an output for providing a mode signal to the particular one of the devices, wherein the control logic is further configured to convey, via the mode signal and during issuance of the prompt to retrieve data from the particular one of the devices, a request that the particular one of the devices operate in a read mode.

13. The system defined in claim 11, wherein the controller further comprises a plurality of inputs for receiving a set of input signals from a second one of the devices.

14. The system defined in claim 13, wherein the control logic is further configured to receive, via the inputs, data output by the particular one of the devices in response to issuance of the prompt.

15. A method, comprising:
   providing a command latch enable signal, an address latch enable signal and an information signal to a first device among a plurality of semiconductor memory devices arranged in a point-to-point ring topology;
   independently providing a respective select signal to each of the devices of the topology;
   selecting a particular one of the devices of the topology;
   issuing specific information to the particular one of the devices by controlling the command latch enable signal, the address latch enable signal and the information signal provided to the first device, wherein when the particular one of the devices is not the first device, the command latch enable signal, the address latch enable signal and the information signal are daisy-chained from the first device to the particular one of the devices via the point-to-point ring topology;
   conveying via the select signal independently provided to the particular one of the devices that the particular one of the devices has been selected; and
   conveying via the select signals independently provided to the other devices that the other devices have not been selected.

* * * * *